United States Patent
Schram et al.

(10) Patent No.: US 9,647,674 B2
(45) Date of Patent: May 9, 2017

(54) APPARATUS FOR GENERATING CLOCK SIGNALS HAVING A PLL PART AND SYNTHESIZER PART WITH PROGRAMMABLE OUTPUT DIVIDERS

(71) Applicant: Microsemi Semiconductor ULC, Kanata (CA)

(72) Inventors: Paul H. L. M. Schram, Bergen op zoom (NL); Krste Mitric, Ottawa (CA); Gabriel Rusaneanu, Ottawa (CA)

(73) Assignee: Microsemi Semiconductor ULC, Kanata, Ontario (CA)

( * ) Notice: Subject to any disclaimer, the term of this patent is extended or adjusted under 35 U.S.C. 154(b) by 0 days.

(21) Appl. No.: 15/091,993

(22) Filed: Apr. 6, 2016

(65) Prior Publication Data

US 2016/0301419 A1   Oct. 13, 2016

Related U.S. Application Data

(60) Provisional application No. 62/144,344, filed on Apr. 8, 2015.

(51) Int. Cl.
*G06F 1/12* (2006.01)
*H03B 19/00* (2006.01)
*H03L 7/16* (2006.01)

(52) U.S. Cl.
CPC ............. *H03L 7/16* (2013.01); *G06F 1/12* (2013.01); *H03B 19/00* (2013.01)

(58) Field of Classification Search
CPC ..... G06F 1/04; G06F 1/10; G06F 1/12; H03B 19/00; H03L 7/00; H03L 7/06; H03L 7/16; H03L 7/18
USPC ....... 327/105, 141, 142, 156, 159, 291, 295, 327/297
See application file for complete search history.

(56) References Cited

U.S. PATENT DOCUMENTS

| | | | |
|---|---|---|---|
| 7,746,178 B1 * | 6/2010 | Humphreys | ............ H03L 7/085 331/1 A |
| 2009/0147902 A1 * | 6/2009 | Liu | .......... H03L 7/091 375/376 |

* cited by examiner

*Primary Examiner* — William Hernandez
(74) *Attorney, Agent, or Firm* — Simon Kahn

(57) ABSTRACT

A clock signal generator responsive to synchronization pulses to perform actions has a phase locked loop (PLL) part including a digitally controlled oscillator (DCO) and an output driver coupled to the DCO, and a synthesizer part including a frequency synthesizer responsive to frequency and phase information from the DCO to generate a synthesized clock and programmable output dividers for generating output clocks from the synthesized clock. An interface establishes communication between the PLL part and the synthesizer part. The output driver is programmed to compute a phase offset required to align a selected output divider with the phase of the DCO and transmit the computed offset to the selected output divider over said interface for application to said selected output divider upon the occurrence of a synchronization pulse.

10 Claims, 3 Drawing Sheets

APPARATUS FOR GENERATING CLOCK SIGNALS HAVING A PLL PART AND SYNTHESIZER PART WITH PROGRAMMABLE OUTPUT DIVIDERS

CROSS REFERENCE TO RELATED APPLICATION

This application claims the benefit under 35 USC 119 (e) of U.S. provisional application No. 62/144,344, filed Apr. 8, 2015, the contents of which are herein incorporated by reference.

FIELD OF THE INVENTION

This invention relates to the field of telecommunications, and more particularly an apparatus for generating clock signals having a phase locked loop (PLL) part and synthesizer part with programmable output dividers.

BACKGROUND OF THE INVENTION

In telecom PLL's output clock signals are divided down from a high frequency clock by programmable dividers. Multiple programmable dividers can be connected to the same high frequency clock. In order to align multiple programmable dividers outputs aligned with other and with the central phase of the PLL filter, some alignment method needs to used. In prior art solutions clock counters in the programmable dividers were overloaded regularly with known values from the programmable divider drivers. Wide busses were required to each programmable divider.

SUMMARY OF THE INVENTION

Embodiments of the invention provide a way to align the programmable dividers by using addressable registers to reset the programmable dividers in combination with common synchronization pulse to bring the programmable dividers in a known state at a known time and after that load offset values through addressable registers to put the programmable dividers in the correct phase.

With this method a single communication channel such as a Serial Peripheral Interface (SPI) can be used to align multiple outputs. This removes the need to use wide busses and as such makes it suitable to use on multiple die system within a single device or even multiple devices.

According to the present invention there is provided an apparatus for generating clock signals, said apparatus being responsive to synchronization pulses to perform actions and comprising: a phase locked loop (PLL) part including a digitally controlled oscillator (DCO) and an output driver coupled to said DCO; a synthesizer part including a frequency synthesizer responsive to frequency and phase information from the DCO to generate a synthesized clock and programmable output dividers for generating output clocks from said synthesized clock; and an interface establishing communication between said PLL part and said synthesizer part; and said output driver being programmed to compute a phase offset required to align a selected output divider with the phase of the DCO and transmit the computed offset to the selected output divider over said interface for application to said selected output divider upon the occurrence of a synchronization pulse.

According to another aspect of the invention there is provided a method of aligning output clocks in an apparatus for generating clock signals, said apparatus being responsive to synchronization pulses to perform actions and comprising a phase locked loop (PLL) part including a digitally controlled oscillator (DCO) and an output driver coupled to said DCO; a synthesizer part including a frequency synthesizer responsive to frequency and phase information from the DCO to generate a synthesized clock and programmable output dividers for generating output clocks from said synthesized clock; said method comprising: said output driver computing a phase offset required to align a selected output divider with the phase of the DCO and transmitting the computed offset to the selected output divider over an interface for application to said selected output divider upon the occurrence of a synchronization pulse.

BRIEF DESCRIPTION OF THE DRAWINGS

This invention will now be described in more detail, by way of example only, with reference to the accompanying drawings, in which.

DETAILED DESCRIPTION OF PREFERRED EMBODIMENTS

Figure 1:
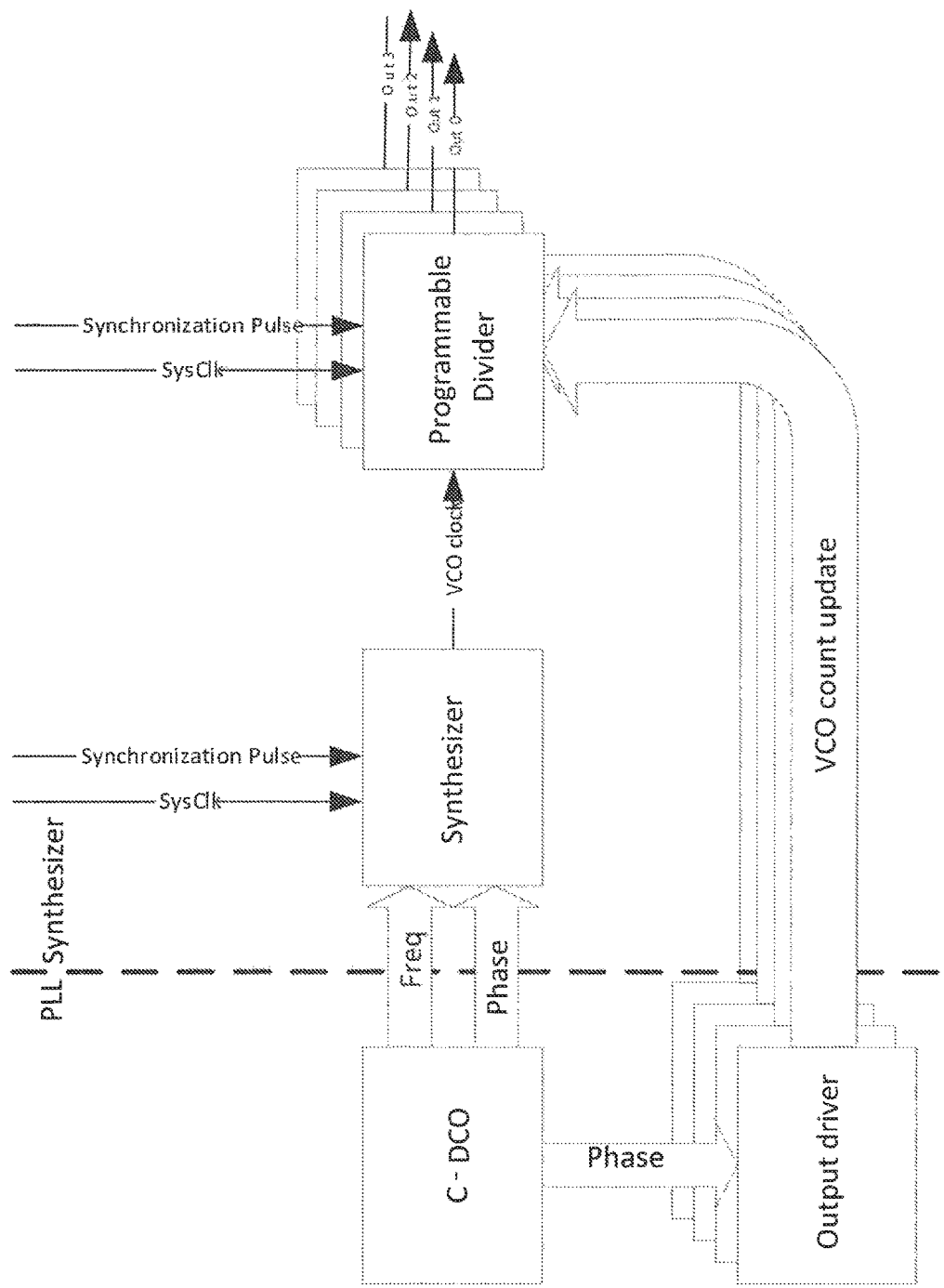
FIG. 1 illustrates a prior art method of aligning programmable divider outputs.

In the prior art alignment method illustrated in FIG. 1, C-DCO is a high accuracy central digitally controlled oscillator of phase locked loop (PLL) shown on the left side of the dashed line, which holds the phase at the next synchronization pulse. The C-DCO interfaces with the synthesizer, shown on the right side of the dashed line, and provides it with a new frequency and phase at the next synchronization pulse. The output of the synthesizer, which is provided by a voltage controlled oscillator (VCO) is accurate in frequency and phase and is divided down by the programmable output dividers to generate the output signals.

The programmable output dividers are aligned by overwriting their VCO counter values at the synchronization pulse with new values calculated in the output drivers based on the phase of the C-DCO.

The disadvantage of this method is that each programmable output divider requires its own VCO count update value. This value requires a wide bus because to divide down a high VCO frequency to 1 or 0.5 HZ requires large counters. As a result, this solution is only suitable for single die systems. On multi die or multi chip solutions the prior art solution is difficult to implement due to the amount of interconnections required.

Figure 2:
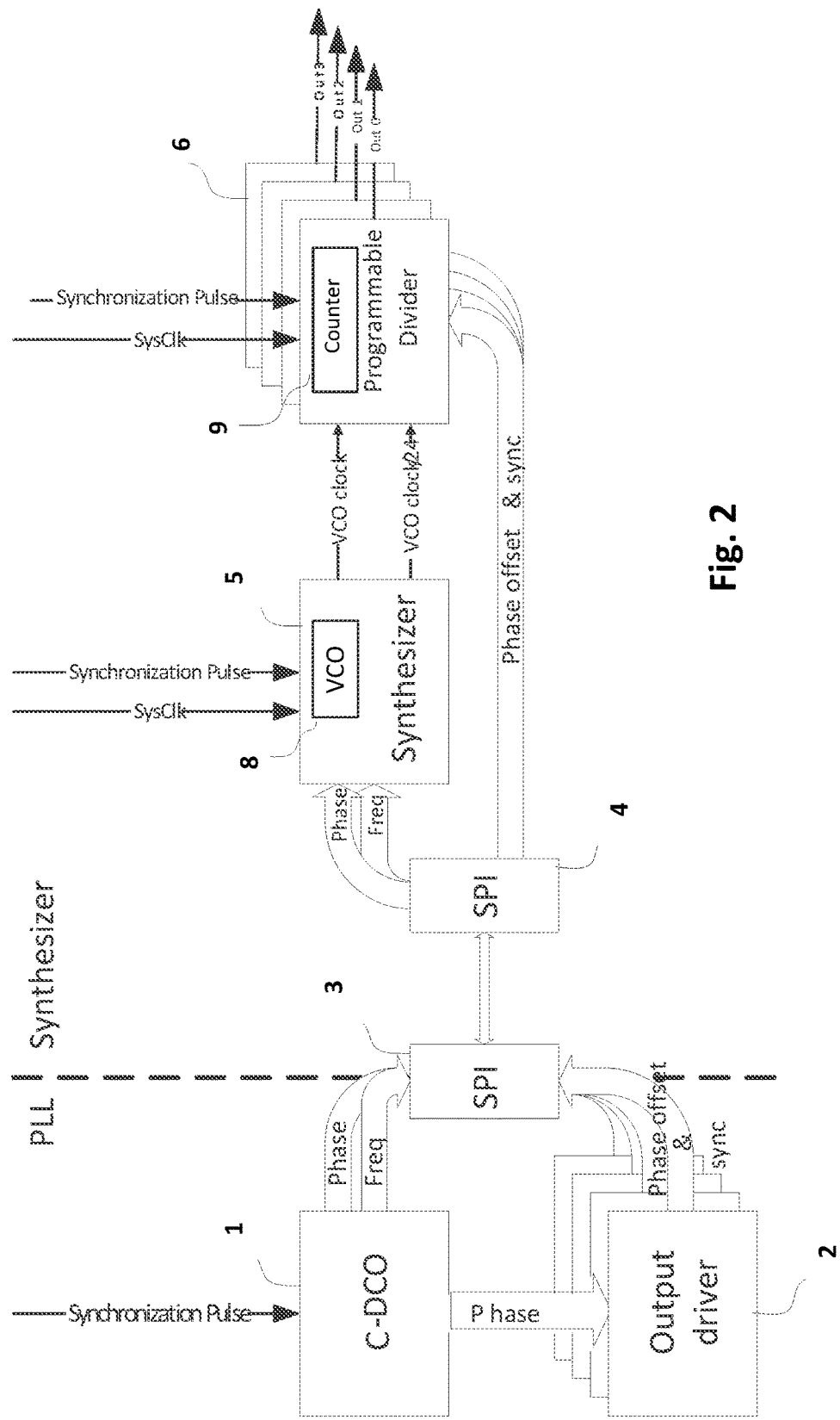
FIG. 2 illustrates an alignment method in accordance with an embodiment of the invention.

Referring now to FIG. 2, which illustrates an embodiment in accordance with the invention, C-DCO 1 is a high accuracy central DCO of the PLL generally referenced 10.

FIG. 2 shows an apparatus that comprises the PLL part 10 on the left side of the dashed line and a synthesizer part 20 on the right side of the dashed line.

The PLL 10 provides phase and frequency information for the synthesizer 5 over a serial connection between the serial peripheral interfaces (SPIs) 3, 4. This phase and frequency information is applied at the next common synchronization pulse, which is a low frequency pulse, typically 3.5 kHz or 7 KHz, transmitted over the SPI interfaces 3, 4 from the output drivers 2. The common synchronization pulse is an important event in the system. All important software updates to hardware, related to data paths, are done in between two sync pulses, and the actual data is held until the next sync pulse occurs. At that particular moment the new data are applied to the hardware.

The synthesizer 5 contains a VCO 8 that generates a high frequency clock that accurately follows the frequency and phase of the C-DCO 1. It may also provide a divided clock (VCOclock/24) to enable the digital logic in the programmable output dividers 6 to run partly at lower speed. The programmable output dividers 6 generate the output clocks Out0 . . . Out3 by dividing the VCO clock. The output dividers 6 contain an internal counter 9 that keeps track of the divider phase.

The output drivers 2 control the programmable output dividers 6 over the SPI interfaces 3, 4.

Figure 3:
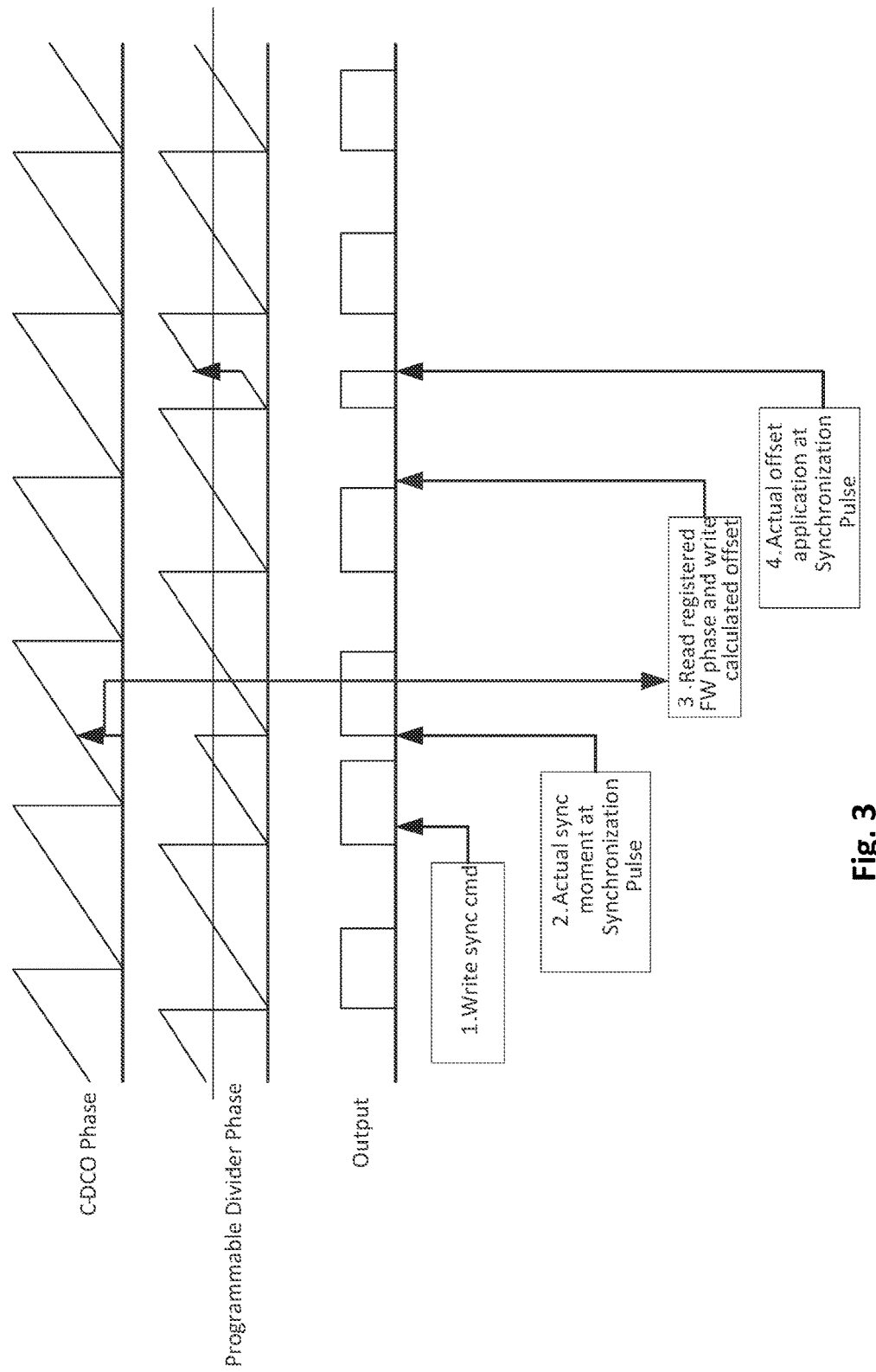
FIG. 3 is a timing chart illustrating the alignment procedure in accordance with an embodiment of the invention.

The alignment procedure is depicted in FIG. 3, which shows the phase of the C-DCO 1, the phase of the programmable divider 6, and the output clock Out0 . . . Out3. The output clock normally consists of a square wave with a 50% duty cycle that follows the phase of the programmable dividers 6.

The rising edge of the output clock is always defined by wrap up point of the output counter value in the programmable dividers (divider phase), i.e. the change from a large value to a small value (close or equal to zero) of the counter 9.

The falling edge of the output clock is defined by the point when the internal phase divider reaches its middle point, i.e. when the output counter 9 reaches half of its programmed value as represented by line 33.

The output clock phase (edge position) is adjusted by adjusting the value of the counter 9, with the goal of aligning it, together with all other outputs, with the phase of the central DCO 1 represented by the waveform in the FIG. 3.

Initially the phase of the C-DCO 1 of the PLL and the phase of the programmable dividers 6 are not aligned as shown by edges 31, 32.

The first step in the alignment process is for the output driver 2 to send a sync command 34 to the SPI interface 3 addressing the programmable output divider 6 that needs to be aligned.

The addressed programmable output divider 6 responds to the sync command by resetting the programmable divider phase at the next common synchronization pulse 35. The value in the counter 9 is set to zero, triggering the rising edge of the output pulse 36.

At this common synchronization pulse 35 the output driver 2 also reads the registered phase 37 of the C-DCO 1 from the SPI interface 3. The output driver 2 now calculates the required phase offset to align the programmable output divider 6, which is a linear mapping of the C-DCO 1 clock domain into the VCO clock domain of the programmable output divider 6.

The calculated phase offset is then transmitted over the SPI interfaces 3, 4 to the programmable output divider 6 at the next synchronization pulse 39. At this point, instead of the counter 9 being reset to zero, the calculated offset is added to the count value as shown at 38. At that point the C-DCO 1 and the programmable output divider 6 are aligned within one VCO clock cycle. The rising next edge of the next output pulse 40 is fully aligned with the phase of the C-DCO 1.

This process is repeated on all programmable output dividers 6 connected to the same synthesizer 5. Because the synchronization pulse used to reset the programmable divider counter 9 is common to each programmable output divider 6 the alignment between the output divider/pattern generators 6 will be better than one VCO clock cycle.

In a second embodiment the programmable dividers 6 are able to register their VCO counter values at the first synchronization pulse. The output driver 2 is able to read this registered value over the SPI Drivers 3, 4 and calculate the difference of this registered VCO counter, which represents the output phase, with the C-DCO 1 phase. This difference can then be transmitted as a phase offset to the programmable dividers 6 over the SPI drivers 3, 4 upon the occurrence of a subsequent synchronization pulse.

The described method permits the alignment of output clocks and PLL phase using a communication bus (parallel or serial) and a common synchronization signal without using a feedback loop from output to PLL input. The method is suitable for multiple die devices using a serial communication bus and a common synchronization signal, and also for additional synthesizers residing in separate packages, using a serial communication bus and a common synchronization signal.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. An apparatus for generating clock signals, said apparatus being responsive to synchronization pulses to perform actions and comprising:
    a phase locked loop (PLL) part including a digitally controlled oscillator (DCO) and an output driver coupled to said DCO;
    a synthesizer part including a frequency synthesizer responsive to frequency and phase information from the DCO to generate a synthesized clock and programmable output dividers for generating output clocks from said synthesized clock; and
    an interface establishing communication between said PLL part and said synthesizer part; and
    said output driver being programmed to compute a phase offset required to align a selected output divider with the phase of the DCO and transmit the computed offset to the selected output divider over said interface for application to said selected output divider upon the occurrence of a synchronization pulse.

2. An apparatus as claimed in claim 1, wherein said output driver is programmed to reset said selected output divider on the occurrence of a first said synchronization pulse, determine a phase of the DCO upon the occurrence of said first said synchronization pulse, compute the phase offset of said selected output divider relative to said DCO, and apply the computed phase offset to said selected output divider upon the occurrence of a subsequent synchronization pulse.

3. An apparatus as claimed in claim 2, wherein said output driver is programmed to apply a sync command to said interface for transmission to said selected output divider, and said interface registers the phase of said DCO upon the occurrence of said first said synchronization pulse.

4. An apparatus as claimed in claim 1, wherein said output driver is programmed to read a phase of said selected output divider on the occurrence of a first said synchronization pulse, determine the phase of the DCO upon the occurrence of said first said synchronization pulse, compute the phase offset of said selected output divider relative to said DCO, and apply the computed phase offset to said selected output divider upon the occurrence of a subsequent synchronization pulse.

5. An apparatus as claimed in claim 1, wherein said interface comprises a pair of serial peripheral interfaces communicating over a bus.

6. A method of aligning output clocks in an apparatus for generating clock signals, said apparatus being responsive to synchronization pulses to perform actions and comprising a phase locked loop (PLL) part including a digitally controlled oscillator (DCO) and an output driver coupled to said DCO; a synthesizer part including a frequency synthesizer responsive to frequency and phase information from the DCO to generate a synthesized clock and programmable output dividers for generating output clocks from said synthesized clock; said method comprising:

said output driver computing a phase offset required to align a selected output divider with the phase of the DCO and transmitting the computed offset to the selected output divider over an interface for application to said selected output divider upon the occurrence of a synchronization pulse.

7. A method as claimed in claim 6, wherein said output driver resets said selected output divider on the occurrence of a first said synchronization pulse, determines a phase of the DCO upon the occurrence of said first said synchronization pulse, computes the phase offset of said selected output divider relative to said DCO, and applies the computed phase offset to said selected output divider upon the occurrence of a subsequent synchronization pulse.

8. A method as claimed in claim 7, wherein said output driver applies a sync command to said interface for transmission to said selected output divider, and said interface registers the phase of said DCO upon transmission of the sync command.

9. A method as claimed in claim 6, wherein said output driver reads a phase of said selected output divider on the occurrence of a first said synchronization pulse, determines the phase of the DCO upon the occurrence of said first said synchronization pulse, computes the phase offset of said selected output divider relative to said DCO, and applies the computed phase offset to said selected output divider upon the occurrence of a subsequent synchronization pulse.

10. A method as claimed in claim 6, wherein said interface comprises a pair of serial peripheral interfaces communicating over a bus.

* * * * *